United States Patent [19]

Mazzochette

[11] Patent Number: 5,739,743
[45] Date of Patent: Apr. 14, 1998

[54] ASYMMETRIC RESISTOR TERMINAL

[75] Inventor: Joseph B. Mazzochette, Cherry Hill, N.J.

[73] Assignee: EMC Technology, Inc., Cherry Hill, N.J.

[21] Appl. No.: 597,498

[22] Filed: Feb. 5, 1996

[51] Int. Cl.⁶ .................. H01C 1/08; H01C 1/012
[52] U.S. Cl. .................. 338/313; 338/51; 338/308; 338/309; 338/314; 338/332
[58] Field of Search ............... 338/20, 271, 272, 338/293, 306, 308, 309, 312, 313, 314, 315, 325, 332; 174/50.5, 50.51; 29/620, 621

[56] References Cited

U.S. PATENT DOCUMENTS

| | | | |
|---|---|---|---|
| 3,778,532 | 12/1973 | Braden | 338/329 |
| 4,706,060 | 11/1987 | May. | |
| 4,829,553 | 5/1989 | Shindo et al.. | |
| 4,839,960 | 6/1989 | Yokoi et al. | 29/620 |
| 5,179,366 | 1/1993 | Wagner. | |
| 5,291,175 | 3/1994 | Ertmer et al. | 338/59 |
| 5,450,055 | 9/1995 | Doi. | |

FOREIGN PATENT DOCUMENTS

| | | |
|---|---|---|
| 4029681 | 4/1992 | Germany. |
| 4127401 | 4/1992 | Japan. |

Primary Examiner—Tu B. Hoang
Attorney, Agent, or Firm—Donald S. Cohen

[57] ABSTRACT

A chip resistor includes a substantially rectangular substrate of an insulating material having opposed substantially flat top and bottom surfaces and edges extending between the top and bottom surfaces. A layer of a resistance material is on the top surface of the substrate. Separate termination layers of a conductive material are on the top surface or the substrate and contact the resistance layer at opposite ends thereof. Each of the termination layers extends across an edge of the substrate and over a portion of the bottom surface of the substrate. The total area of the portions of the termination layers on the bottom surface of the substrate is greater than the total area of the portions of the termination layers on the top surface of the substrate so that the spacing between the ends of the portions of the termination layers on the bottom surface of the substrate is smaller than the spacing between the ends of the portions of the termination layers on the top surface of the substrate.

9 Claims, 1 Drawing Sheet

ASYMMETRIC RESISTOR TERMINAL

FIELD OF THE INVENTION

The present invention relates to an asymmetric resistor terminal, and, more particularly, to a chip resistor having an asymmetric terminal for better heat conduction.

BACKGROUND OF THE INVENTION

Chip resistors are commonly used on printed circuit boards that use principally or exclusively surface mountable components. Surface mounting reduces the cost of the printed circuit board since it requires no drilling or plating of holes in the board. Also, the components are less expensive since they require no leads projecting therefrom, and the assembly of the components on the board is easier and less expensive since it does not require the threading of leads through holes in the board. Chip resistors are commonly produced with solderable metal terminals on either end. Referring to FIG. 1, there is shown a commonly used prior art chip resistor 10. This chip resistor 10 comprises a substantially rectangular substrate 12 of an insulating material having flat top and bottom surfaces 14 and 16 and ends 18. A layer 20 of a resistance material is coated on the top surface 14. A conductive metal terminal layer 22 is coated on the top surface 14 at each end of the resistance layer 20. Each of the terminal layers 22 extends across its adjacent end 18 of the substrate 12 and across a portion of the bottom surface 16. Each of the terminal layers 22 is of the same length and both mounted on a printed circuit board 24 with the portion of each terminal layer 22 on the bottom surface 16 of the substrate 12 being seated on and secured to a conductor 26 on the board 24 by a conductive solder 28.

The electrical energy dissipated by the resistor 10 is converted to heat. The heat is carried away form the resistor 10 by natural and/or forced convection, radiation and by conduction through the solder connections between the terminal layers 22 and the conductors 26 on the board 24. Conductive cooling of the resistor 10 is dependent upon the thermal resistance of the solder connection. Therefore, it would be desirable to decrease the thermal resistance between the resistor and the printed circuit board so as to increase the amount of heat carried away from the resistor and thereby increase the power capability of the resistor.

SUMMARY OF THE INVENTION

A resistor comprising a substrate of an insulating material having opposed, substantially flat first and second surfaces and edge surfaces extending between the first and second surfaces. A layer of a resistance material is on the first surface of the substrate. A separate termination film of a conductive material is on the first surface of the substrate at spaced ends of the resistance layer. Each of the termination films extends over an edge of the substrate and over a portion of the second surface of the substrate. The total area of the termination films on the second surface of the substrate being greater than the total area of the termination films on the first surface of the substrate.

DETAILED DESCRIPTION

Figure 2:
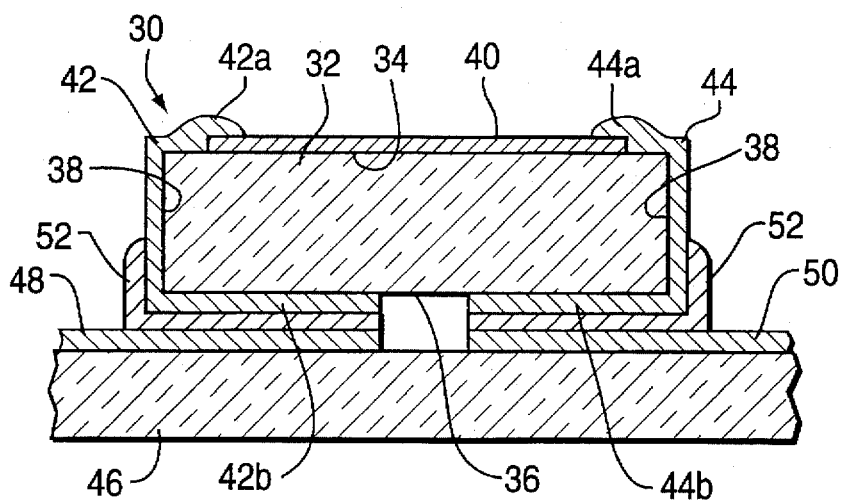
FIG. 2 is a sectional view of one form of a chip resistor of the present invention mounted on a printed circuit board.

Referring now to FIG. 2, a form of the chip resistor of the present invention is generally designated as 30. Chip resistor 30 comprises a substantially rectangular substrate 32 of an insulating material, such as a ceramic, having substantially flat opposed top and bottom surfaces 34 and 36 and end surfaces 38 extending between the top and bottom surfaces 34 and 36. On the top surface 34 of the substrate 32 is a layer 40 of a resistance material. The resistance layer 40 may be of any well known resistance material, such as a thin layer of a suitable metal or metal alloy, or a thick film material formed of particles of a conductive metal or metal alloy in a glass matrix.

On the top surface 34 of the substrate 32 at each end of and in contact with the resistance material layer 40 is a terminal layer 42 and 44 of a conductive material. Each of the terminal layers 42 and 44 is of a conductive material, such as a conductive metal or metal alloy or a thick film material formed of particles of a conductive metal or metal alloy in a glass matrix. Each of the terminal layers 42 and 44 extends across a separate end surface 38 of the substrate and over a portion of the bottom surface 36 of the substrate. The total area of the portions 42b and 44b of the terminal layers 42 and 44 on the bottom surface 36 of the substrate is greater than the total area of the portions 42a and 44a of the terminal layers 42 and 44 on the top surface 34 of the substrate 32. Thus, the space between the ends of the portions 42b and 44b of the terminal layers 42 and 44 is less than the space between the ends of the portions 42a and 44a of the terminal layers 42 and 44. As shown in FIG. 2, the portions 42b and 44b of the terminal layers 42 and 44 are of substantially the same length so that the space between them is positioned substantially midway between the end surfaces 38 of the substrate 32. However, the portions 42b and 44b of the terminal layers 42 and 44 are longer than the portions 42a and 44a of the terminal layers.

Figure 1:
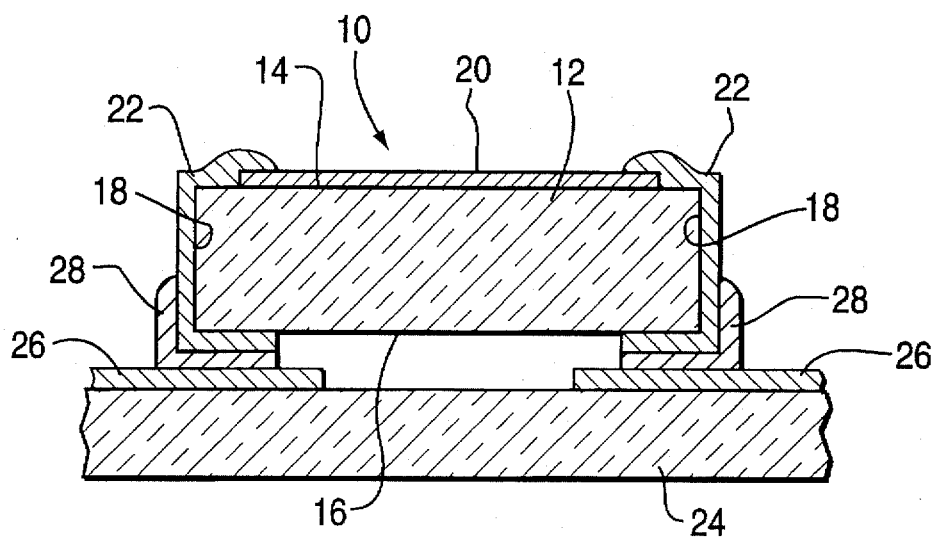
FIG. 1 is a sectional view of a prior art chip resistor mounted on a printed circuit board.

In the use of the chip resistor 30, the resistor 30 is mounted on a printed circuit board 46 as shown in FIG. 2. The resistor 30 is mounted on the printed circuit board 46 with the portions 42b and 44b of the terminal layers 42 and 44 over and seated on separate metal conductors 48 and 50 respectively on the surface of the printed circuit board 46. The terminal layers 42 and 44 are electrically and mechanically connected to the metal conductors 48 and 50 by a conductive solder 52. Since the area of the portions 42b and 44b of the terminal layers 42 and 44 is greater than the portions 42a and 44a, the area of contact between the portions 42b and 44b of the terminal layers 42 and 44 and the conductors 48 and 50 is greater than in the prior art chip resistor shown in FIG. 1. This permits a greater amount of heat to be conducted from the terminal layers 42 and 44 to the conductors 48 and 50. This, in turn, provides for greater cooling of the resistor 30 so that it can operate a higher powers.

Figure 3:
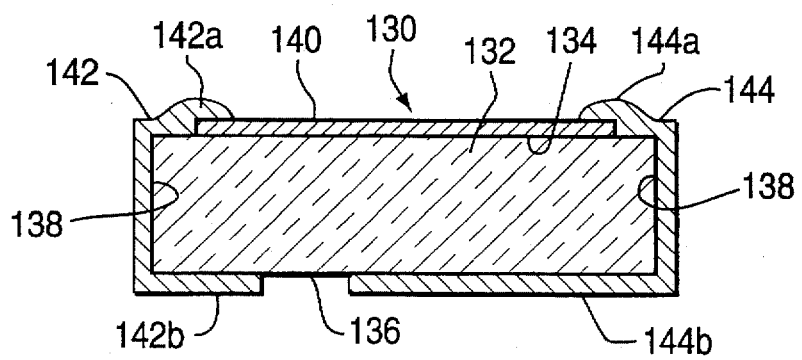
FIG. 3 is a sectional view of another form of a chip resistor of the present invention.

Referring now to FIG. 3, another form of the chip resistor of the present invention is generally designated as 130. Chip resistor 130 comprises a substantially rectangular substrate 132 of an insulating material, such as a ceramic, having opposed, substantially flat top and bottom surfaces 134 and 136 and end surfaces 138 connecting the top and bottom surfaces 134 and 136. On the top surface 134 of the substrate 132 is a layer 140 of a resistance material. Also on the top surface 134 are a pair of terminal layers 142 and 144 of a conductive material. The terminal layers 142 and 144 are at the ends of the resistance layer 140 and are in contact with the resistance layer 140. Each of the terminal layers 142 and 144 extends across a separate end 138 of the substrate onto and over a portion of the bottom surface 136 of the substrate 132. The total area of the portions 142b and 144b of the terminal layers 142 and 144 on the bottom surface 136 of the substrate 132 is greater than the total area of the portions 142a and 144a of the terminal layers 142 and 144 on the top surface 134 of the substrate 132. Thus, the space between ends of the portions 142b and 144b of the terminal layers 142 and 144 is smaller than the space between the portions 142a and 144a of the terminal layers 142 and 144. However, in the chip resistor 130, the portion 144b of the terminal layer 144 is longer than the portion 142b of the terminal layer 142 so that the space between the portions 142b and 144b of the terminal layers 142 and 144 is offset from the center of the bottom surface 136 of the substrate 132 so as to be closer to one end of the substrate than the other end. However, the portion 144b of the terminal layer 144 is longer than the portion 144a of the terminal layer 144.

The chip resistor 130 is used in the same manner as the chip resistor 30 shown in FIG. 2. The chip resistor 130 is mounted on a printed circuit board with the portions 142b and 144b of the terminal layers 142 and 144 being seated on separate conductors and electrically and mechanically secured thereto by a conductive solder. As with the chip resistor 30, the greater area of the portions 142b and 144b of the terminal films 142 and 144 provides for a larger conduction of heat from the resistor 130 to the conductors of the printed circuit board. This provides increased cooling of the resistor 130 so that it can operate at higher powers.

Thus, there is provided by the present invention a chip resistor having conductive terminal layers extending from the ends of a resistance layer on the top surface of a substrate across the end surfaces of the substrate and over a portion of the bottom surface of the substrate. The portions of the terminal layers on the bottom surface of the substrate is of a larger area than the portions of the terminal layers on the top surface of the substrate. This provides an asymmetrical terminal in which the space between the portions of the terminal layers on the bottom surface of the substrate is smaller than the space between the portions of the terminal layers on the top surface of the substrate. The space between the portions of the terminal layers on the bottom surface of the substrate may be positioned midway between the ends of the substrate or offset from the midpoint so as to be closer to one end of the substrate than the other. This asymmetrical terminal provides from greater conduction of heat from the resistor to a printed circuit board on which the resistor is mounted to allow for operation at larger powers.

What is claimed is:

1. A resistor comprising:

a substrate of an insulating material having opposed, substantially flat first and second surfaces and edge surface extending between the first and second surfaces;

a layer of a resistance material on the first surface of the substrate and having a pair of ends; and a separate termination layer of a conductive material on the first surface at each of said spaced ends of the resistance layers, each of said termination layers extending over an edge surface of the substrate and on a portion of the second surface of the substrate, each termination layer having a seperate end on each of the first and second surfaces of the substrate rate with the ends of the termination on layers on each surface of the substrate being spaced apart;

the total area of the termination layer on the second surface of the substrate being greater than the area of the termination layers on the first surface of the substrate.

2. A resistor in accordance with claim 1 wherein the substrate is substantially rectangular and has end edges between the first and second surfaces, and the termination layers extend over the end edges between the first and second surfaces.

3. A resistor in accordance with claim 2 wherein the spacing between the ends of the termination layers on the second surface of the substrate is smaller than the spacing between the ends of the termination layers on the first surface of the substrate.

4. A resistor in accordance with claim 3 wherein the space between the ends of the termination layers on the second surface of the substrate is positioned substantially midway between the end edges of the substrate.

5. A resistor in accordance with claim 3 wherein the space between the ends of the termination layers on the second surface of the substrate is positioned closer to one end of the substrate than the other end.

6. A resistor in accordance with claim 3 in which a portion of at least one of the termination layers which is on the second surface of the substrate is longer than a portion of the termination layer on the first surface of the substrate.

7. A resistor in accordance with claim 6 in which the portions of both of the termination layers which and on the second surface of the substrate is longer than the portions of the termination layers on the first surface of the substrate.

8. A resistor in accordance with claim 7 in which the portions of the termination layers which are on the second surface of the substrate are of substantially the same length.

9. A resistor in accordance with claim 6 in which the portions of the termination layers which are on the second surface of the substrate are of different lengths.

* * * * *

UNITED STATES PATENT AND TRADEMARK OFFICE
CERTIFICATE OF CORRECTION

PATENT NO. : 5,739,743  
APPLICATION NO. : 08/597498  
DATED : April 14, 1998  
INVENTOR(S) : Joseph B. Mazzochette Page 1 of 1

It is certified that error appears in the above-identified patent and that said Letters Patent is hereby corrected as shown below:

Column 4, lines 7-8, after "edge" delete "surface" and insert --surfaces--.

Column 4, line 14, after "resistance" delete "layers" and insert --layer--.

Column 4, line 18, delete "rate".

Column 4, line 19, between "termination" and "layers", delete "on".

Column 4, line 21, after "termination" delete "layer" and insert --layers--.

Column 4, line 48, delete "and" and insert --are--.

Signed and Sealed this
Twenty-seventh Day of September, 2011

David J. Kappos
*Director of the United States Patent and Trademark Office*